United States Patent [19]

Katoh

[11] Patent Number: 5,258,646
[45] Date of Patent: Nov. 2, 1993

[54] PACKAGE FOR MICROWAVE IC

[75] Inventor: Takayuki Katoh, Itami, Japan

[73] Assignee: Mitsubishi Denki Kabushiki Kaisha, Tokyo, Japan

[21] Appl. No.: 780,309

[22] Filed: Oct. 22, 1991

[30] Foreign Application Priority Data

Nov. 16, 1990 [JP] Japan .................. 2-312199

[51] Int. Cl.⁵ .................. H01L 23/12; H01L 23/14
[52] U.S. Cl. .................. 257/678; 257/684; 257/698; 257/728; 257/706; 257/711
[58] Field of Search .................. 357/74, 80, 81; 257/678, 684, 698, 728, 706, 711

[56] References Cited

U.S. PATENT DOCUMENTS

| | | | |
|---|---|---|---|
| 4,259,684 | 3/1981 | Dean et al. .................. | 357/80 |
| 4,639,760 | 1/1987 | Granberg et al. .................. | 357/75 |
| 4,649,416 | 3/1987 | Borkowski et al. .................. | 357/75 |
| 4,868,639 | 9/1989 | Mugiya et al. .................. | 357/74 |
| 4,901,041 | 2/1990 | Pengelly .................. | 357/80 |
| 4,933,745 | 6/1990 | O'Shea et al. .................. | 357/74 |
| 4,953,001 | 8/1990 | Kaiser, Jr. et al. .................. | 357/74 |
| 4,985,753 | 1/1991 | Fujioka et al. .................. | 357/80 |
| 5,045,820 | 9/1991 | Leicht et al. .................. | 333/26 |
| 5,138,436 | 8/1992 | Koepf .................. | 357/74 |

FOREIGN PATENT DOCUMENTS 2655195 11/1990 France .
2659184 3/1991 France .
2-69967 3/1990 Japan .

OTHER PUBLICATIONS

10th GaAs IC Symposium 1988, CH2599-9/88, F. Ishitsuka et al.: "Low Cost, High-Performance Package for a Multi-Chip MMIC Module", pp. 221-224.

Primary Examiner—Eugene R. LaRoche
Assistant Examiner—Viet Q. Nguyen
Attorney, Agent, or Firm—Oblon, Spivak, McClelland, Maier & Neustadt

[57] ABSTRACT

A microwave IC package comprises a base (1) and a plurality of cavities (2a) and (2b) for mounting IC chips (5a) and (5b), the cavities (2a) and (2b) being formed on the base (1). Also provided on the base (1) are terminals (4a), (4b), (8a), (8b) and (8c) which are connected to said IC chips by wire bonding. The cavities (2a) and (2b) are separated from each other by a grounded conductor (3A). Due to the separation, isolation between the input and the output of the IC package is improved.

8 Claims, 5 Drawing Sheets

PACKAGE FOR MICROWAVE IC

BACKGROUND OF THE INVENTION

1. Field of the Invention

The present invention relates to a package for a semiconductor integrated circuit, for example, which operates in a high-frequency band of several tens MHz or over.

2. Description of the Prior Art

FIG. 4A is a plan view showing a conventional metal base type package while FIG. 4B is a sectional view taken along the line C—C of FIG. 4A.

Referring to FIGS. 4A and 4B, in a microwave IC package 30, space 2 for mounting IC chip (referred to as "cavity" hereinafter) is provided in a metal base 1 while a metal ring 3 for shielding is fixed through a mount 3a of insulating material to the metal base 1, surrounding the cavity 2.

On the right and left sides of the cavity 2, microstrip-shaped feedthroughs 4a, 4b are formed. The feedthroughs 4a, 4b are formed by patterning a conductor, such as gold and the like, to form microstrip lines on dielectrics of ceramic or the like, and they extend from opposite ends of the metal base 1 under the mount 3a until they reach the cavity 2.

The feedthrough 4a is used as an RF terminal for input while the feedthrough 4b is used as an RF terminal for output.

Similarly, on a dielectric 6 of ceramic or the like DC terminals 8a, 8b, 8c are formed by patterning a conductive material, such as gold and the like, in the direction orthogonal to the shaft line of the feedthroughs 4a, 4b.

A single or a plurality of high-frequency IC chips are attached to the cavity 2; FIG. 5 shows an example when two high-frequency IC chips are mounted. In this example, high-frequency IC chips 5a, 5b are fixed on the cavity 2 by means of soldering, using adhesive agent or the like, and connected with each other by wire 9 while each of them is connected to the feedthroughs 4a, 4b and the DC terminals 8a, 8b, 8c in the similar way. For those connections, ribbon bond or the like may be employed instead of the wire bond.

In a configuration of the above-mentioned microwave IC package, since the feedthrough 4a for input and the feedthrough 4b for output are opposite to each other and close to each other with the cavity 2 interposed therebetween, part of an input signal from the feedthrough 4a for input may leak immediately to the feedthrough 4b for output without passing to the high-frequency IC chips 5a, 5b; hence, there is the disadvantage that isolation between the input and output of the package 30 deteriorates and an excellent switching device cannot be obtained.

SUMMARY OF THE INVENTION

A microwave IC package according to the present invention comprises a base, a plurality of cavities provided on the base for setting IC chips, at least one ground conductor provided in the base for partitioning off the cavities, and a terminal provided in the base and connected to the IC chips.

In another aspect of the present invention, a microwave IC package comprises a base, a plurality of cavities provided on the base for setting IC chips, at least one dielectric provided in the base for partitioning off the cavities and having a plurality of throughholes, and a terminal provided on the base and connected to the IC chips.

According to the present invention, since a microwave IC package is provided with a shield of at least one ground conductor or one dielectric having a plurality of throughholes between feedthroughs for input and output, isolation between the input and the output is extremely improved; therefore, an input signal from a terminal for input never leak immediately to a terminal for output, and thus, an excellent switching device can be obtained.

Accordingly, it is an object of the present invention to provide a microwave IC package which has a simple configuration to effect good isolation between input and output terminals.

These and other objects, features, aspects and advantages of the present invention will become more apparent from the following detailed description of the present invention when taken in conjunction with the accompanying drawings.

BRIEF DESCRIPTION OF THE DRAWINGS

FIG. 1A is a plan view showing a preferred embodiment of a microwave IC package according to the present invention while

FIG. 3A is a plan view of another preferred embodiment of the microwave IC package according to the present invention while

FIG. 4A is a plan view showing a conventional microwave IC package while

DETAILED DESCRIPTION OF THE PREFERRED EMBODIMENT

Now, preferred embodiments according to the present invention will be described with reference to the accompanying drawings.

Figure 1A:
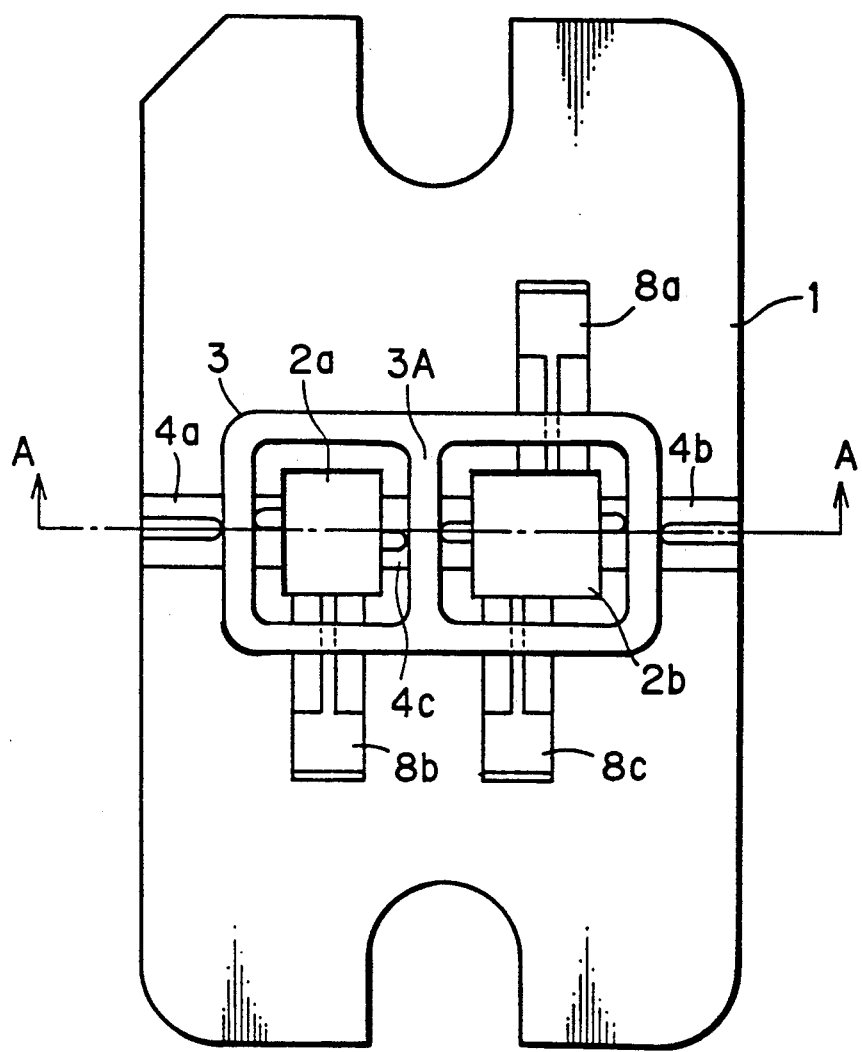
Figure 1B:
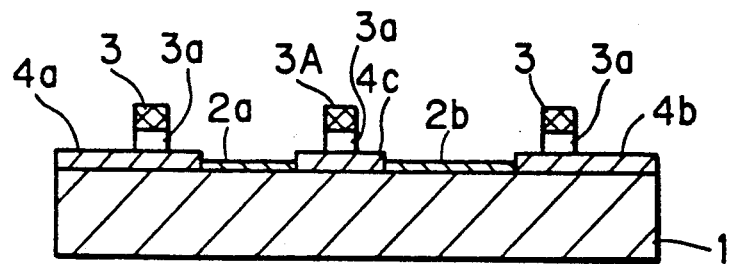
FIG. 1B is a sectional view along the line A—A of FIG. 1A.

FIG. 1A is a plan view showing a first preferred embodiment of a microwave IC package according to the present invention while FIG. 1B is a sectional view along the line A—A of FIG. 1A.

Figure 4A:
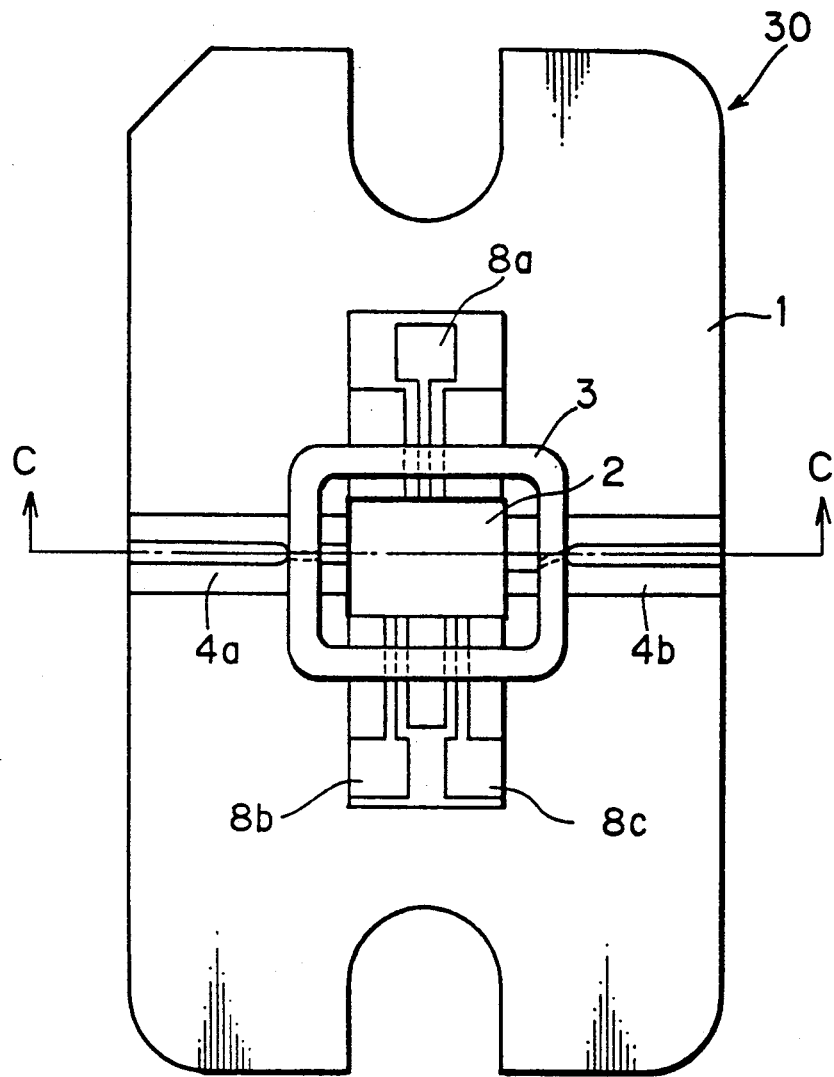
Figure 4B:
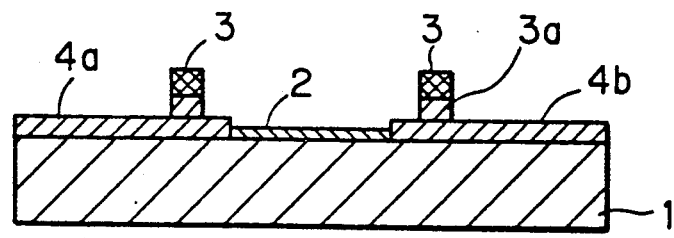
FIG. 4B is a sectional view along the line C—C of FIG. 4A.
Figure 5:
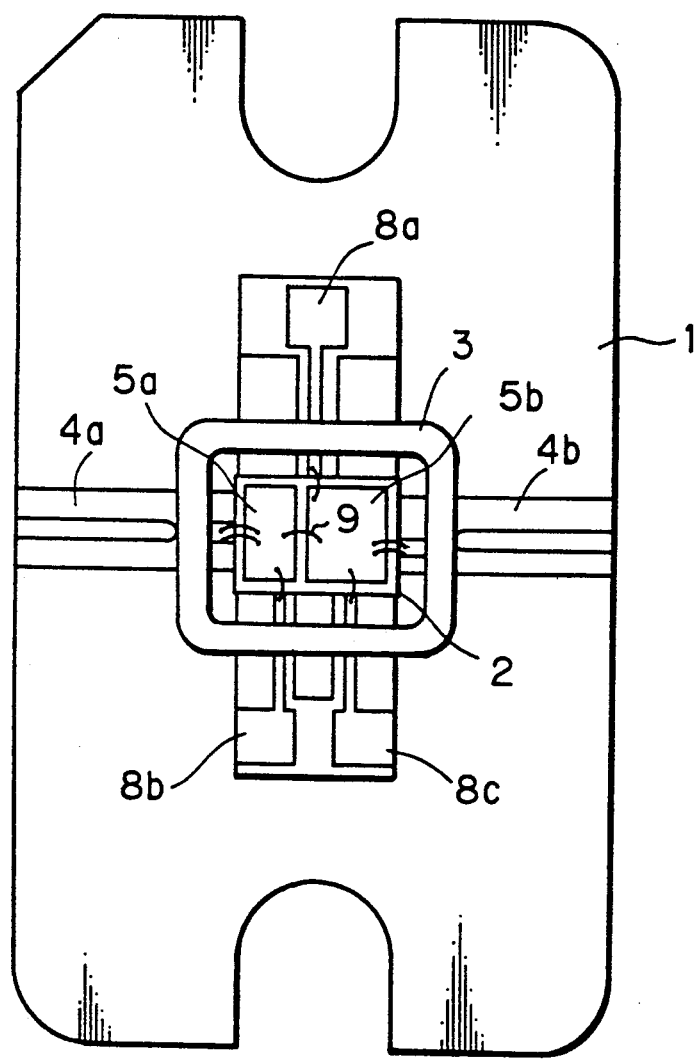
FIG. 5 is a plan view showing the conventional microwave IC package with a high-frequency IC chip packaged therein.

Since like reference numerals denote corresponding parts to those in FIGS. 4 and 5, the explanation on them is omitted.

A microwave IC package 10 in this embodiment is formed of components almost identical with those for a conventional package 30. A cavity includes separate cavities 2a and 2b. A metal ring 3 has a partition 3A in the center portion for shielding the cavities 2a and 2b from each other, and the metal ring 3 is fixed through a ceramic mount 3a to a metal base 1.

Between the cavities 2a and 2b, a feedthrough 4c is formed extending under the mount 3a.

Figure 2:
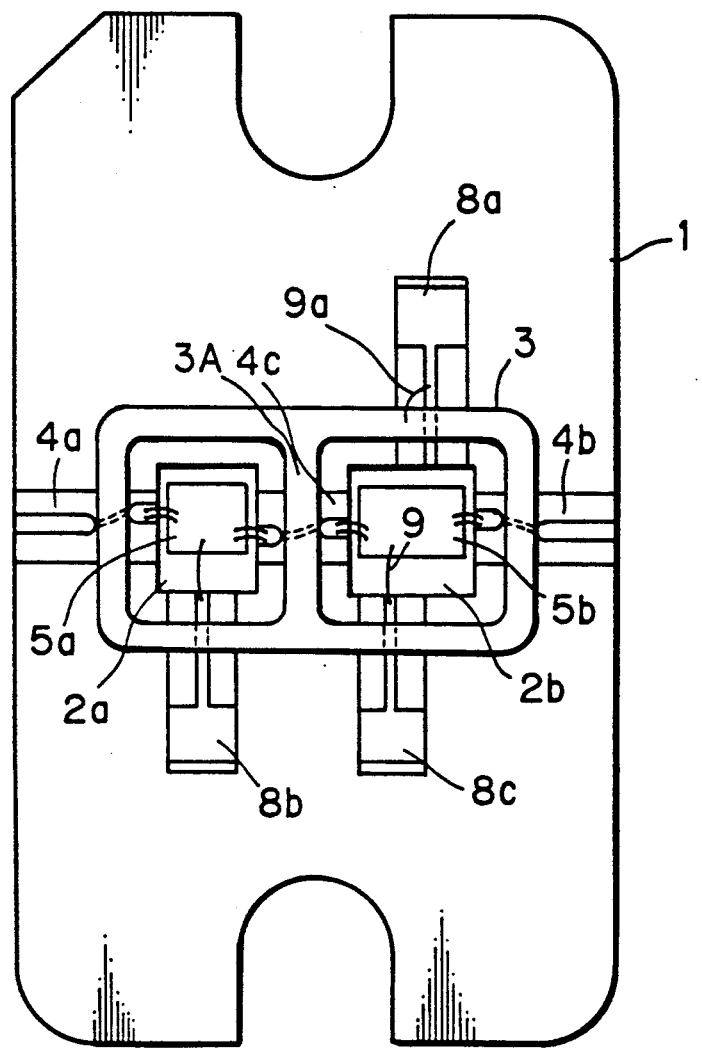
FIG. 2 is a plan view of the microwave IC package of FIG. 1A with a high-frequency IC chip packaged therein.

FIG. 2 is a plan view showing the microwave IC package 10 shown in FIG. 1A with high-frequency IC chips attached therein.

Two high-frequency IC chips 5a and 5b are fixed to the cavities 2a and 2b, respectively, by means of soldering, using adhesive agent or the like, and they are connected to feedthroughs 4a, 4b, 4c and DC terminals 8a, 8b, 8c by wire 9. For such connections, ribbon bonding or other means may be employed instead of the wire bond.

The metal ring 3 is connected to the DC terminal 8a by wire 9a. When the package 10 is attached to other device, the DC terminal 8a is connected to a ground circuit of the device.

In this embodiment, there are two separate cavities and the ground conductor 3A intervenes between them; hence, isolation between the feedthrough 4a for input and the feedthrough 4b for output is extremely improved.

While a metal-base and metal-ring type package has been explained in the above first embodiment, another (second) preferred embodiment employing a multi-stratum dielectric package will be explained.

Figure 3A:
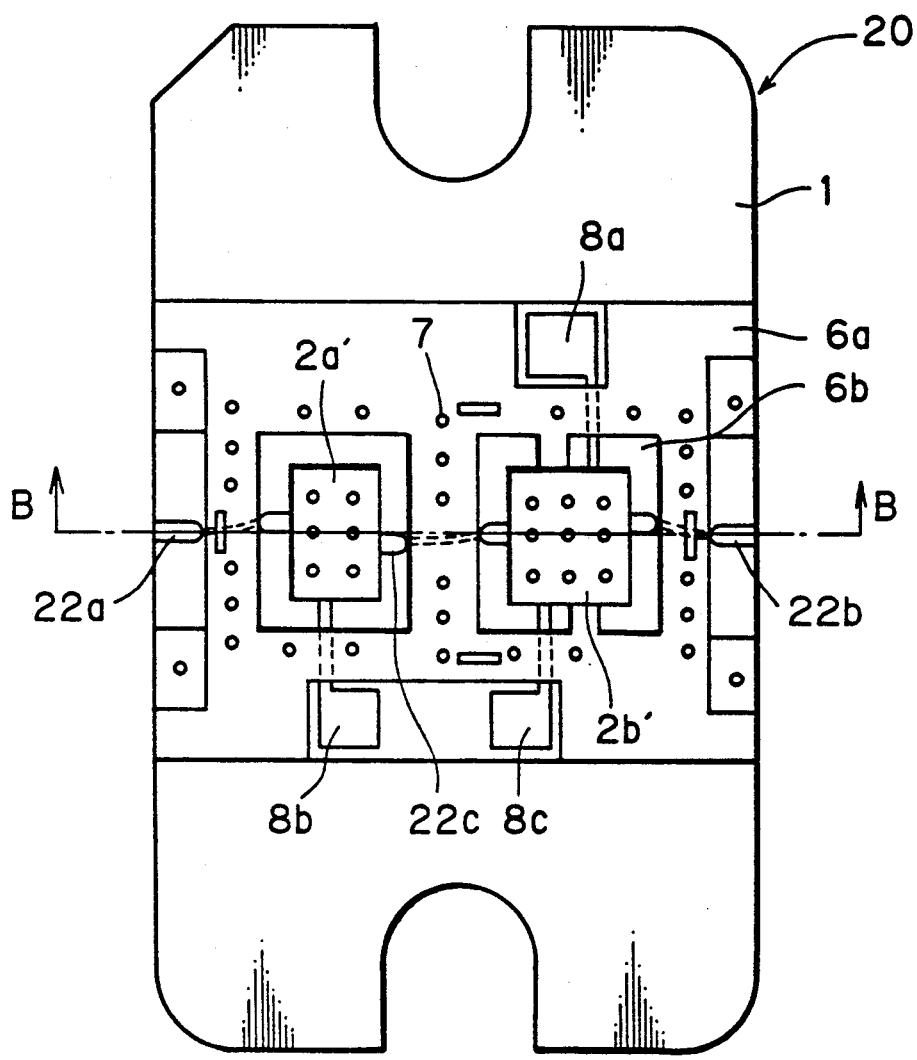
Figure 3B:
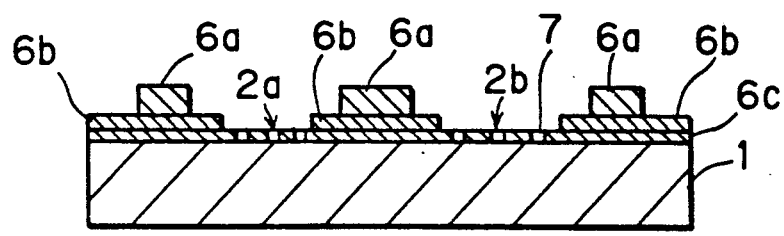
FIG. 3B is a sectional view along the line B—B of FIG. 3A.

FIG. 3A is a plan view showing a microwave IC package of the second preferred embodiment while FIG. 3B is a sectional view along the line B—B of FIG. 3A.

In FIGS. 3A and 3B, a microwave IC package 20 has dielectric layers 6a, 6b, 6c overlaid with one another in the order from the uppermost on a metal base 1, and two portions of the lowermost layer 6c define cavity 2a' or 2b' in their respective exposed surfaces.

In this embodiment, there is not particularly provided any feedthrough, but microstrip lines 22a, 22b, 22c are formed by patterning gold, for example, to form microstrips directly on the dielectric layer 6b.

Each of the dielectric layers 6a, 6b, 6c is provided with a plurality of throughholes 7 which are helpful to attain a shielding effect.

In this way, in the second embodiment, there are two separate cavities in a multi-stratum dielectric type package while a dielectric partition with a plurality of throughholes is formed between them; therefore, RF terminals for input and output are shielded from each other, and there is an effect that isolation between the input and the output is extremely improved similar to the first embodiment.

Furthermore, while a metal package base is employed in the second embodiment similar to the first embodiment, a package base may be formed of dielectric material and the whole package may be structured of dielectric layers to obtain the similar effect.

While an example in which two separate cavities are provided has been described in the previously mentioned first and second preferred embodiments, there may be provided three or more cavities which are all divided by partitions of ground conductors or dielectrics with throughholes; and naturally, isolation between the input and output is further increased.

While the invention has been shown and described in detail, the foregoing description is in all aspects illustrative and not restrictive. It is therefore understood that numerous modifications and variations can be devised without departing from the scope of the invention.

I claim:

1. A microwave IC package, comprising:
   a base;
   a plurality of cavities provided on said base for mounting a plurality of IC chips in said cavities, wherein said plurality of IC chips are electrically connected to each other so as to form a circuit comprising input and output feedthrough microstriplines connected in series with said electrically connected IC chips;
   at least one ground conductor provided on said base for partitioning off said cavities, wherein said ground conductor has a thickness sufficient to electrically and physically shield said IC chips from one another when said IC chips are mounted in said cavities; and
   at least one terminal provided in said base and connected to said IC chips.

2. A microwave IC package in accordance with claim 1, wherein said base is made of metal.

3. A microwave IC package in accordance with claim 1, further comprising
   a metal ring provided through an insulator on said base and surrounding all the cavities, wherein said ground conductor and said metal ring are formed together as a single one-piece body.

4. A microwave IC package in accordance with claim 1, wherein
   said at least one terminal includes a terminal for input and a terminal for output, and
   said cavities are aligned in series between said terminals for input and output.

5. A microwave IC package, comprising:
   a base;
   a plurality of cavities provided on said base for mounting a plurality of IC chips in said cavities, wherein said plurality of IC chips are electrically connected to each other so as to form a circuit comprising input and output feedthrough microstrip lines connected in series with said electrically connected IC chips;
   at least one dielectric layer provided on said base for partitioning off said cavities and having a thickness sufficient to electrically and physically shield said IC chips from one another when said IC chips are mounted in said cavities and having a plurality of throughholes; and
   at least one terminal provided on said base and connected to said IC chips.

6. A microwave IC package in accordance with claim 5, further comprising
   at least three dielectric layers provided on said base so as to form an uppermost layer, a second uppermost layer and a third uppermost layer, wherein
   the uppermost and second uppermost layers of said dielectric layers each have a plurality of openings formed therein, wherein said openings of the uppermost layer and second uppermost layer are aligned with each other; and
   said cavities are formed in said openings.

7. A microwave IC package in accordance with claim 5, wherein
   said at least one terminal includes a terminal for input and a terminal for output, and
   said cavities are aligned in series between said terminals for input and output.

8. A microwave IC package in accordance with claim 6, wherein said at least one terminal is formed on an exposed portion of the second uppermost dielectric layer of said dielectric layers.

* * * * *